(12) United States Patent
Yabuuchi et al.

(10) Patent No.: US 6,361,924 B1
(45) Date of Patent: Mar. 26, 2002

(54) AQUEOUS PHOTOSOLDER RESIST COMPOSITION

(75) Inventors: Naoya Yabuuchi, Toyonaka; Minoru Fujita, Ibaraki; Osamu Namba, Takarazuka; Keiichi Okajima, Osaka, all of (JP)

(73) Assignee: Nippon Paint Co., Ltd., Osaka (JP)

( * ) Notice: Subject to any disclaimer, the term of this patent is extended or adjusted under 35 U.S.C. 154(b) by 0 days.

(21) Appl. No.: 09/633,062

(22) Filed: Aug. 4, 2000

(30) Foreign Application Priority Data

| Aug. 5, 1999 | (JP) | ............................. 11-222830 |
| Nov. 30, 1999 | (JP) | ............................. 11-340481 |
| Jun. 6, 2000 | (JP) | .............................. 2000-168579 |

(51) Int. Cl.$^7$ ........................... G03F 7/033; G03F 7/038
(52) U.S. Cl. ............................ 430/280.1; 430/285.1; 522/84
(58) Field of Search ..................... 430/280.1, 285.1; 522/84

(56) References Cited

U.S. PATENT DOCUMENTS

| 5,364,736 A | * | 11/1994 | Eramo, Jr. et al. ....... 430/280.1 |
| 5,501,942 A | * | 3/1996 | Salvin et al. ............ 430/280.1 |
| 5,925,499 A | * | 1/1999 | Hernandez et al. ...... 430/280.1 |
| 6,045,972 A | * | 4/2000 | Salvin et al. ............ 430/280.1 |
| 6,207,346 B1 | * | 3/2001 | Johnson ................... 430/284.1 |

FOREIGN PATENT DOCUMENTS

| EP | 0599075 A | 6/1994 |
| EP | 0633503 A | 1/1995 |

OTHER PUBLICATIONS

Patent Abstracts of Japan (JP 04–294352 A) Oct. 10, 1992.
Patent Abstracts of Japan (JP 05–100427 A), Apr. 23, 1993.

* cited by examiner

*Primary Examiner*—Cynthia Hamilton
(74) *Attorney, Agent, or Firm*—Townsend & Banta

(57) ABSTRACT

Disclosed are aqueous photosolder resist compositions containing (A) an aqueous solution prepared by neutralizing a resin containing a free-radically polymerizable group and a carboxyl group with a base; (B) an inorganic filler; (C) a photocurable mixture of (c-1) a multifunctional acrylic monomer, (c-2) a compound having a cyclic ether group other than a glycidyl group and (c-3) a photoinitiator; and optionally (D) an aqueous solution prepared by neutralizing a frege-radically polymerized substance having an acid value of 130–230 mgKOH/mg. The cyclic ether group other than a glycidyl group is an alicyclic epoxy or oxetane group, for example.

7 Claims, No Drawings

AQUEOUS PHOTOSOLDER RESIST COMPOSITION

BACKGROUND OF THE INVENTION

1. Field of the Invention

The present invention relates to aqueous photosolder resist compositions which can be alkali developed, and also to solder resist films formed from the compositions.

2. Description of Related Art

Solder resist compositions are generally used in the form of liquid dispersions which are applied, in the form of coatings, onto substrates such as printed circuit boards. Images are transferred to the coatings by a sequence of light exposure and development. Their curing levels are further increased by the subsequent exposure to heat or light. The compositions for use in the formation of such solder resist films are typically solvent-borne. The use of a solvent is not desirable from an environmental point of view. This has led to the need to develop water-borne or aqueous solder resist compositions.

Japanese Patent Laying-Open No. Hei 5-100427 (1993) discloses active energy radiation-curable resins prepared by partially reacting α-olefin having 6 or more carbon atoms with maleic anhydride, reacting the product with a compound having an unsaturated double bond and a hydroxyl group in a molecule, and then neutralizing the product with an alkaline substance to render it water-dispersible. It also discloses aqueous photosolder resist compositions containing a compound having at least one epoxy group.

Due to the incorporation of a glycidyl-form epoxy group which has a tendency to deactivate in an aqueous medium, the disclosed aqueous photosolder resist compositions suffer from the reduced stability when stored in the form of a liquid mixture containing a principal resin and a curing agent. This problem is attributed to the glycidyl group which is caused to react while the compositions are stored or dried. Its reaction also leads to reductions in various properties, e.g., reduces developability and heat resistance as a result of failure to form uniform films. Also, some compositions, in spite of their aqueous form, release solvent odors to adversely affect working environments. Other deficiencies include pattern defects after development and heat resistance reduction, as a result of insufficient dispersion stability of inorganic fillers.

SUMMARY OF THE INVENTION

It is an object of the present invention to provide an aqueous photosolder resist composition which is free from solvent odors and has satisfactory storage stability and excellent heat resistance.

The aqueous photosolder resist composition of the present invention contains:

(A) an aqueous solution prepared by neutralizing a resin containing a free-radically polymerizable group and a carboxyl group with a base;
(B) an inorganic filler;
(C) a photocurable mixture containing (c-1) a multifunctional acrylic monomer, (c-2) a compound having a cyclic ether group other than a glycidyl group and (c-3) a photoinitiator; and optionally
(D) an aqueous solution prepared by neutralizing a free-radically polymerized substance having an acid value of 130–230 mgKOH/mg with a base.

The aforementioned cyclic ether group other than a glycidyl group may be an alicyclic epoxy or oxetane group, for example. The aforementioned resin preferably has a free-radically polymerizable group content of $5\times10^{-4}$–$1\times10^{-2}$ mole/g and a carboxyl group content (i.e., acid value) of 30–200 mgKOH/g, more preferably of 30–130 mgKOH/g. The molar ratio of carboxyl groups present in the aqueous solutions (A) and (D) to cyclic ether groups, exclusive of glycidyl groups, present in the photocurable mixture (C) may be 1.3/0.7–0.7/1.3, for example.

The aqueous photosolder resist composition of the present invention may further contain a coloring pigment. The inorganic filler is contained preferably in the amount of 5–60 parts by weight, based on 100 parts by weight of solids in the aqueous photosolder resist composition. The solvent, if used, is contained preferably in the amount of not above 20 parts by weight, based on 100 parts by weight of solids in the composition.

The solder resist film of the present invention can be formed according to the following procedure: The aqueous photosolder resist composition of the present invention is coated on a substrate, dried at 50–90° C., exposed to an active energy beam through a mask so that it is photocured in a patterned region. The resulting resist coating is developed by removing its unexposed region with the aid of an alkaline cleaner, and then exposed to heat at 140–170° C. to increase a cure level of the previously photocured region.

DETAILED DESCRIPTION OF THE INVENTION

Detailed explanation will be now given concerning the aqueous photosolder resist composition of the present invention which contains (A) an aqueous solution prepared by neutralizing a resin having a free-radically polymerizable group and a carboxyl group with a base; (B) an inorganic filler; (C) a photocurable mixture (C) containing (c-1) a multifunctional acrylic monomer, (c-2) a compound having a cyclic ether group other than a glycidyl group and (c-3) a photoinitiator; and optionally (D) an aqueous solution prepared by neutralizing a free-radically polymerized substance having an acid value of 130–230 mgKOH/mg with a base.

(A) Aqueous Solution Prepared by Neutralizina a Resin Containina a Free-Radically Polymerizable Group and a Carboxyl Group with a Base A first component incorporated in the aqueous photosolder resist composition of the present invention is obtained by neutralizing a resin containing a free-radically polymerizable group and a carboxyl group with a base. The resin contains at least one free-radically polymerizable group and at least one carboxyl group in a molecule and preferably has a free-radically polymerizable group content of $5\times10^{-4}$–$1\times10^{-2}$ mole/g and a carboxyl group content (i.e., acid value) of 30–200 mgKOH/g.

The free-radically polymerizable group content of below $5\times10^{-4}$ mole/g may lead to the insufficient cure level and accordingly to the reduced heat resistance of the resulting resist. If the free-radically polymerizable group content exceeds $1\times10^{-2}$ mole/g, an undesired proportion thereof may be left remained in the resulting resist. The carboxyl group content of below 30 mgKOH/g may result in the reduced alkaline developability. If the carboxyl group content exceeds 200 mgKOH/g, the dissolution of the exposed resist coating region may also result. It is more preferred that the free-radically polymerizable group content is in the range of $1\times10^{-3}$–$5\times10^{-3}$ mole/g and the carboxyl group content is in the range of 30–150 mgKOH/g. The carboxyl group content is still more preferably in the range of 30–130 mgKOH/g, most preferably in the range of 70–110 mgKOH/g.

The aforementioned resin containing a free-radically polymerizable group and a carboxyl group preferably has a number average molecular weight within the range of 1,500–25,000. If the number average molecular weight is below 1,500, the insufficient heat resistance may be imparted to the resulting resist. If it exceeds 25,000, it becomes difficult for the resin to be dispersed in water.

The type of the aforementioned resin containing a free-radically polymerizable group and a carboxyl group is not particularly specified. Such a resin can be prepared, for example, by reacting a compound having plural epoxy groups with a compound having a free-radically polymerizable group and a carboxyl group, such as acrylic acid, and then allowing the hydroxyl groups produced as a result of the reaction to react with acid anhydride.

Various compounds can be used for the compound having plural epoxy groups. Examples of such compounds include aromatic polyepoxy compounds represented by the following structural formulas 1a–1c, as described in Japanese Patent Publication No. Hei 7-103213, and epoxides represented by the following structural formulas 2a and 2b and obtainable by reacting condensation products of phenols and phenolic hydroxyl-containing aromatic aldehyde with epihalohydrin, as described in Japanese Patent No. 2868190. In the formula 1, n is a value preferably in the range of 1–20. In the formula 2, m is a value preferably in the range of 0–15, more preferably in the range of 0–10.

[Structural Formula 1]

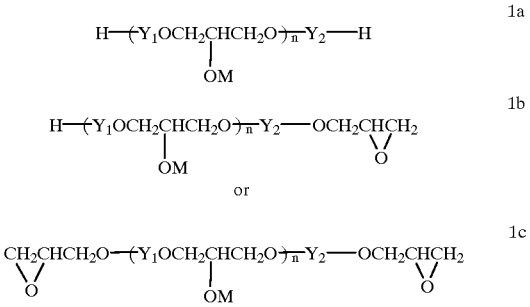

wherein $Y_1$ and $Y_2$ represent aromatic residual groups, respectively and independently; n is a number of 1 or higher; and M represents a hydrogen atom or an epoxymethyl group on conditions that, if n=1, M is an epoxymethyl group and, if n=2 or higher, at least one of M is an epoxymethyl group.

[Structural Formula 2]

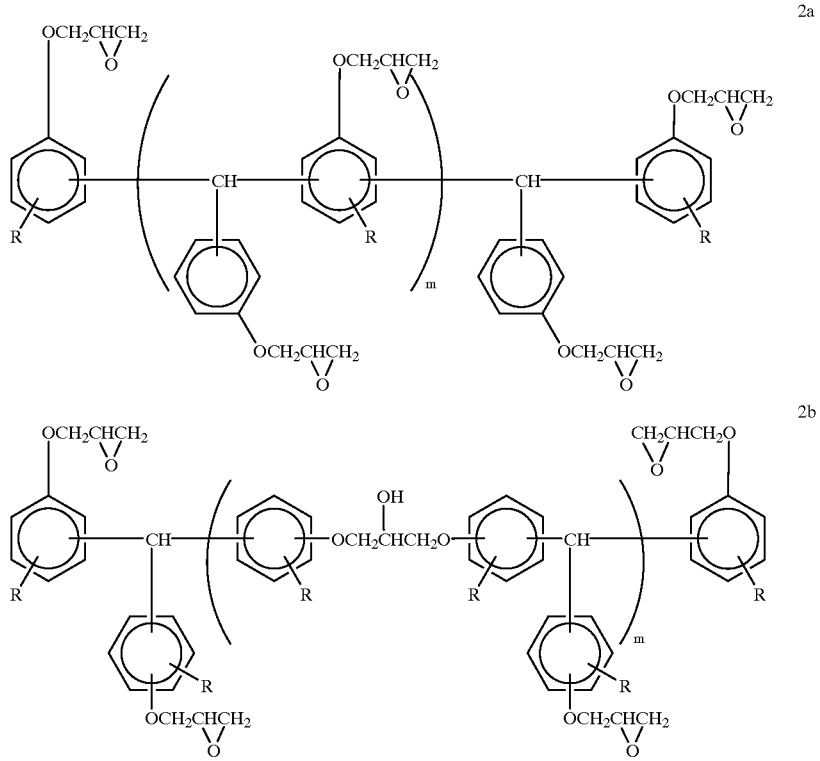

wherein R is H or $CH_3$ and m is a number of 0, 1 or higher.

Other suitable compounds having plural epoxy groups can be obtained by reacting a polymer derived from an acid anhydride-containing monomer with a compound having a free-radically polymerizable group and a hydroxyl group, such as 2-hydroxyethyl acrylate.

The resin having a radically-polymerizable group and a carboxyl group, when its carboxyl group is neutralized by the addition of a base, yields the aforementioned aqueous solution (A). The type of the base used is not particularly specified and may be selected from those widely recognized as neutralizing agents, examples of which include inorganic materials such as sodium hydroxide, potassium hydroxide and lithium hydroxide; and amine compounds such as triethyl amine, diethanolamine and diisopropylmethylamine. The amount of the base is suitably chosen depending upon the molecular weight of the particular resin containing a free-radically polymerizable group and a carboxyl group and its carboxyl content. The base may be added in the amount sufficient to render the resin water-soluble, e.g., in the amount to neutralize 30–200% of the carboxyl groups.

(B) Inorganic Filler

A second component incorporated in the aqueous photosolder resist composition of the present invention is an inorganic filler. The use of inorganic filler is to improve heat resistance of the resulting resist. Useful inorganic fillers are known in the art and include barium sulfate, finely powdered silicon carbide, amorphous silica and the like. Conventional flame-retardants are other examples of organic fillers. Dispersion of the inorganic filler can be achieved by adding directly to the above-described aqueous solution (A). For better dispersion, the inorganic filler may be rendered into an aqueous dispersion form before it is added to the aqueous solution (A).

The amount of the inorganic filler used is determined in terms of its proportion relative to a total solids weight of the aqueous photosolder resist composition of the present invention. This proportion will be discussed later in the description of the aqueous photosolder resist composition.

(C) Photocurable Mixture

A third component incorporated in the aqueous photosolder resist composition of the present invention is a photocurable mixture containing a multifunctional acrylic monomer (c-1), a compound (c-2) having a cyclic ether group other than a glycidyl group and a photoinitiator (c-3). The photocurable mixture exists in the form of being emulsified in the aqueous photosolder resist composition of the present invention.

(1) Multifunctional Acrylic Monomer (c-1)

The multifunctional acrylic monomer (c-1) has two or more polymerizable groups in a molecule. The incorporation of this multifunctional acrylic monomer (c-1) allows the composition to be photocured for the patterning purpose.

Examples of specific multifunctional acrylic monomers (c-1) include pentaerythritol triacrylate, dipentaerythritol pentaacrylate, polyethylene glycol diacrylate, polypropylene glycol diacrylate, trimethylolpropane triacrylate, pentaerythritol tetraacrylate, dipentaerythritol hexaacrylate and corresponding methacrylates. These monomers can be used alone or in any combination thereof.

(2) Compound (c-2) Having a Cyclic Ether Group Other Than a Glycidyl Group

The compound (c-2) having a cyclic ether group other than a glycidyl group, when heated, is caused to undergo a curing reaction with a carboxyl group of the resist composition. The inclusion of glycidyl group, among various cyclic ether groups, is not favored because of its tendency to deactivate in an aqueous medium. Preferred examples of cyclic ether groups are an alicyclic epoxy group and an oxetane group. Other cyclic ether groups may be introduced, for example, by oxidizing a substance having a double bond in its main chain, such as polybutadiene, or by allowing a compound having a vinyl-coupled alicyclic epoxy to undergo a ring-opening polymerization and subsequent oxidation. However, the use of the aforementioned two types is preferred since they are readily available in commerce.

Various types of alicyclic epoxy-containing compounds are sold in the market and include, for example, CELLOXIDE Series, EPOLEED Series and CYCLOMER Series, commercially available from Daicel Chem. Co., Ltd., and polymerizates thereof. Such compounds may contain the following structure in a molecule:

[Structural Formula 3]

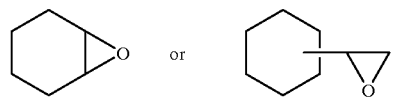

The oxetane-containing compounds are also available in commerce, e.g., under the trade designations ALON-OXETANE Series from Toa Gosei Co., Ltd. The use of those containing two or more alicyclic epoxy or oxetane groups in a molecule, among the above-cited compounds, is preferred. The use of those containing three or more alicyclic epoxy or oxetane groups is particularly preferred.

(3) Photoinitiator (c-3)

Various photoinitiators conventionally known in the art can be used. Examples of specific photoinitiators include benzoin and benzoin alkyl ethers such as benzoin methyl ether, benzoin ethyl ether and benzoin propyl ether; acetophenones such as acetophenone, 2,2-dimethoxy-2-phenyl acetophenone, 2,2-diethoxy-2-phenylacetophenone and 1,1-dichloroacetophenone; aminoacetophenones such as 2-methyl-1-[4-(methylthio) phenyl]-2-morpholinopropanone-1,2-benzyl-2-dimethylamino-1-(4-morpholinophenyl)-butanone-1,N,N-dimethyl aminoacetophenone; anthraquinones such as 2-methyl anthraquinonoe, 2-ethylanthraquinone, 2-tertiary-butyl anthraquinonoe and 1-chloroanthraquinone; thioxanthones such as 2,4-dimethylthioxanthone, 2,4-diethylthioxanthone, 2-chlorothixanthone and 2,4-diisopropylthioxanthone; ketals such as acetophenone dimethyl ketal and benzyl dimethyl ketal; benzophenones or xanthones such as benzophenone and 4,4'-bis(diethylamino)benzophenone; 2,4,6-trimethylbenzoyl-diphenylphosphine oxide and the like. These may be used alone or in any combination thereof. When needed, auxiliary photoinitiators may further be added, including ethyldimethyl-amino benzoate and tertiary amines such as triethanolamine.

The amounts of the multifunctional acrylic monomer (c-1), compound (c-2) having a cyclic ether group other than a glycidyl group and photoinitiator (c-3) incorporated in the photocurable mixture are determined in terms of their individual proportions relative to solids in the aqueous photosolder resist composition of the present invention. These proportions will be discussed later in the description of the aqueous photosolder resist composition.

Besides the aforementioned components, the photocurable mixture may further contain an amino-containing compound, such as triazine, which reacts with the cyclic ether group.

(D) Optional Aqueous Solution Prepared by Neutralizing a Free-Radically Polymerized Substance Having an Acid Value of 130–230 maKOH/ma with a Base A fourth component optionally incorporated in the aqueous photosolder resist composition of the present invention is an aqueous solution prepared by neutralizing a free-radically polymerized substance having an acid value of 130–230 mgKOH/g with a base. The use of such an aqueous solution increases dispersibility of the inorganic filler. Examples of free-radically polymerized substances include copolymerization products of acidic monomers (carboxyl-containing monomers), such as acrylic acid, methacrylic acid, maleic anhydride and maleic acid, with acid group-free vinyl monomers such as carboxyl-free vinyl monomers. Useful free-radically polymerized substances have acid values (carboxyl contents) within the range of 130–230 mgKOH/g. The free-radically polymerized substance, if its acid value is below the specified range, reduces its ability to stably disperse inorganic fillers therein and, if its acid value is above the specified range, becomes almost incompatible with the aqueous solution (A) and photocurable mixture (C) to result in the failure to obtain a uniform coating film.

Preferably, the free-radically polymerized substance has a number average molecular weight in the range of 1,000–150,000. Its number average molecular weight, if below 1,000, may result in the reduced dispersibility of pigments, such as inorganic fillers, and, if above 150,000, increases a viscosity of the aqueous solution to an excessive level that may result in the difficulty to disperse inorganic fillers.

Aqueous Photosolder Resist Composition

As stated above, the aqueous photosolder resist composition of the present invention contains (A) an aqueous solution obtainable by neutralizing a resin containing a free-radically polymerizable group and a carboxyl group with a base, (B) inorganic filler; (C) photocurable mixture comprising (c-1) a multifunctional acrylic monomer, (c-2) a compound having a cyclic ether group other than a glycidyl group and (c-3) a photoinitiator; and optionally (D) an aqueous solution obtainable by neutralizing a free-radically polymerized substance having an acid value of 130–230 mgKOH/mg with a base.

The aqueous photosolder resist composition of the present invention can be obtained by blending the above-listed components according to techniques well-known to those skilled in the art. For performance improvements of the resist composition and resulting resist, the components are preferably blended in such proportions that satisfy the following conditions.

A molar ratio (carboxyl/cyclic ether) of a carboxyl group content of the aqueous solutions (A) and (D) to a cyclic ether (exclusive of glycidyl) group content of the photocurable mixture (C) is preferably 1.3/0.7–0.7/1.3. If the molar ratio falls outside this range, the level of crosslinking will decrease, possibly leading to the insufficient heat resistance of the resulting resist. More preferably, the molar ratio is maintained within the range of 1.15/0.85–0.85/1.15.

A ratio (resin/free-radically polymerized substance) by weight of the resin in the aqueous solution (A) to the free-radically polymerized substance in the aqueous solution (D) is preferably 70/30–100/0. If the weight ratio exceeds 30%, delamination of a resist coating may be caused to occur during development.

The inorganic filler (B) is incorporated preferably in the amount of 5–60 parts by weight, based on 100 parts by weight of solids in the aqueous photosolder resist composition of the present invention. The amount of inorganic filler, if below 5 parts by weight, may result in the difficulties to impart sufficient heat resistance and to suppress shrinkage on curing and, if above 60 parts by weight, may result in the insufficient development. More preferably, it is maintained within the range of 15–35 parts by weight.

The multifunctional acrylic monomer (c-1) is contained in the photocurable mixture (C) preferably in the amount of 2.0–15.0 parts by weight, based on 100 parts by weight of solids in the aqueous photosolder resist composition of the present invention. If its amount falls below 2.0 parts by weight, insufficient photocuring may result. On the other hand, if its amount exceeds 15.0 parts by weight, the reduced heat resistance may result.

The photoinitiator (c-3) is incorporated in the photocurable mixture (C) preferably in the amount of 0.5–10 parts by weight, based on 100 parts by weight of solids in the aqueous photosolder resist composition of the present invention. If its amount falls below 0.5 parts by weight, a larger proportion of unreacted double bonds may remain. On the other hand, if its amount exceeds 10 parts by weight, the molecular weight may decrease excessively to result in the reduction in hardness of a resulting resist. The range within 1.0–8 parts by weight is more preferred.

The aqueous photosolder resist composition of the present invention may further contain a compound, such as melamine, that functions to increase a crosslinking level via its reaction with a hydroxyl group produced as a result of reaction between carboxyl and cyclic ether groups. The melamine may preferably be added in the amount of 40 or lower parts by weight, based on 100 parts by weight of the cyclic ether-containing compound (c-2).

Other than the above-described components, the aqueous photosolder resist composition of the present invention may further contain an internal solvent, when needed. This is employed to aid in the formation of a uniform film. Useful solvents have the ability to dissolve oil contents of the above-described components, boiling points preferably within the range of 120–250° C., more preferably within the range of 135–200° C., and hydrophilic properties. Examples of specific solvents include propylene glycol diacetate, dipropylene glycol monomethyl ether and propylene glycol monomethyl ether acetate. The internal solvent, if used, is added preferably in the amount of 20 or lower parts by weight, more preferably of 10 or lower parts by weight, based on 100 parts by weight of solids in the aqueous photosolder resist composition of the present invention. If its amount exceeds 20 parts by weight, the use of aqueous form for the purposes of obviating odor and safety concerns may become meaningless. The internal solvent may be added to any one of the above-described components, or formulated with those components into the aqueous photosolder resist composition.

The aqueous photosolder resist composition of the present invention may further incorporate a color pigment. Examples of useful color pigments are conventionally known in the art and include copper phthalocyanine, chlorinated copper pththalocyanine, quinacridone red and the like. The color pigment, if incorporated, may be present preferably in the amount of 0.02–4.0 parts by weight, based on 100 parts by weight of solids in the aqueous photosolder resist composition of the present invention. If the amount falls below 0.02 parts by weight, its coloring effect may become insufficient. On the other hand, if the amount exceeds 4.0 parts by weight, the photocurability decreases to the level that possibly causes delamination of the resist coating during development. The amount of 0.1–1.5 parts by weight is more preferred.

The aqueous photosolder resist composition of the present invention can be obtained by mixing the above-specified components, for example, according to the following procedures: The aqueous solution (A) is first prepared by neutralizing a resin containing a free-radically polymerizable group and a carboxyl group with a base. The inorganic filler (B) and an optional color pigment are added for dispersion in the aqueous solution (A) to which each of all components of (C), together with an optional internal solvent, are subsequently added to form an emulsion.

The aqueous solution (D), if used, may be mixed with the aqueous solution (A) prior to addition of the inorganic filler (B). The inorganic filler (B) is added and dispersed in the mixture to which each of all components of (C) is subsequently added to form an emulsion. Alternatively, the inorganic filler (B) may be added for dispersion in the aqueous solution (D) to which the aqueous solution (A) and then each of all components of (C) are sequentially added to form an emulsion.

The aqueous photosolder resist composition of the present invention, as such obtained in the emulsion form, contains dispersed particles having a surface mean diameter preferably of 0.1–10.0 μm, more preferably of 0.3–2.0 μm. It is substantially impractical to prepare an emulsion containing dispersed particles having a surface mean diameter of below 0.1 μm. If the dispersed particles have a surface diameter of above 10.0 μm, precipitation or flocculation thereof may be caused to occur.

The aqueous photosolder resist composition of the present invention preferably has a solids content of 20–70 weight %, more preferably of 35–60 weight %. The resist composition becomes economically disadvantageous when its solids content falls below 20 weight %. If its solids content exceeds 70 weight %, particles may be caused to fuse together and increase their sizes. A long-term storage of the aqueous photosolder resist composition of the present invention is assured if a mixture of the aqueous solution (A), optional aqueous solution (D) and inorganic filler (B) is stored separately from the photocurable mixture (C) before they are mixed together for actual use.

A solder resist film can be obtained according to the following procedures. The aqueous photosolder resist composition of the present invention is applied, in the form of a film, to a substrate, such as a board, dried generally at 50–90° C., and then exposed to an active energy ray, such as an ultraviolet ray, through a mask. Development is achieved by removing the unexposed region with the aid of an alkaline cleaner. The photocured region is then exposed, for example, to heat at 140–170° C. so that its cure level is promoted by heat cure.

DESCRIPTION OF THE PREFERRED EXAMPLES

PREPARATION EXAMPLE 1

Preparation of an Aqueous Solution (A-1) via Neutralization of a Compound Having a Free-Radically Polymerized Group and a Carboxyl Group with a Base A 2-liter flask equipped with a reflux tube, thermostat and stirring element was charged with the below-listed ingredients.

| Ingredients | Parts by Weight |
| --- | --- |
| EOCN-104S[1] | 400 |
| Propylene glycol monomethyl ether acetate | 250 |
| Hydroquinone | 0.50 |
| Tetrabutylammonium bromide | 0.20 |

[1] A cresol-novolak type cyclic ether resin manufactured by Nippon Kayaku Co., Ltd.

The mixture was placed under a stream of oxygen and maintained at 90° C. 148.3 parts by weight of acrylic acid was added dropwise over 30 minutes and the reaction was continued for additional 24 hours. At this point, its acid value was found to be approximately 0.

136.6 parts by weight of succinic anhydride was then added and the reaction was continued for 10 hours. The resulting product was found to have a solids acid value of 111.8 mgKOH/g and a free-radically polymerizable group content of $3.0 \times 10^{-3}$ mole/g.

The reaction mixture was then cooled to 50° C. After addition of 148.0 parts by weight of triethylamine, the reaction mixture was stirred for 20 minutes, followed by addition of 800 parts by weight of deionized water. The resulting mixture was placed under a reduced pressure and heated to remove almost all amount of the organic solvent and a fraction of water to obtain an aqueous solution (A-1) having a solids percentage of 48.2%.

PREPARATION EXAMPLE 2

Preparation of an Aqueous Solution (A-2) via Neutralization of a Compound Having a Free-Radically Polymerized Group and a Carboxyl Group with a Base A 2-liter flask equipped with a reflux tube, thermostat and stirring element was charged with the below-listed ingredients.

| Ingredients | Parts by Weight |
| --- | --- |
| EPOLEED GT-400[2] | 400 |
| Propylene glycol monomethyl ether acetate | 250 |
| Hydroquinone | 0.50 |
| Tetrabutylammonium bromide | 0.20 |

[2] An alicyclic epoxy resin manufactured by Daicel Chem. Co., Ltd. which is a terminal alicyclic epoxy-containing product of ring-opening addition of ε-caprolactone to butanetetracarboxylic acid.

The mixture was placed under a stream of oxygen and maintained at 90° C. 148.3 parts by weight of acrylic acid was added dropwise over 30 minutes and the reaction was continued for additional 24 hours. At this point, its acid value was found to be approximately 0.114.6 parts by weight of succinic anhydride was then added and the reaction was continued for 10 hours. The resulting product was found to have a solids acid value of 97.0 mgKOH/g and a free-radically polymerizable group content of $3.1 \times 10^{-3}$ mole/g.

The reaction mixture was then cooled to 50 0° C. After addition of 120.0 parts by weight of triethylamine, the reaction mixture was stirred for 20 minutes, followed by addition of 800 parts by weight of deionized water. The resulting mixture was placed under a reduced pressure and heated to remove almost all amount of the organic solvent and a fraction of water to obtain an aqueous solution (A-2) having a solids percentage of 51.2%.

PREPARATION EXAMPLE 3

Preparation of an Aqueous Solution (A-3) via Neutralization of a Compound Having a Free-Radically Polymerized Group and a Carboxyl Group with a Base A 2-liter flask equipped with a reflux tube, thermostat and stirring element was charged with the below-listed ingredients.

| Ingredients | Parts by Weight |
|---|---|
| Polyepoxy compound[3] | 287 |
| Acrylic acid | 68.5 |
| Methylhydroquinone | 0.35 |
| Triphenylphosphine | 2.0 |
| Butyl acetate | 191.4 |

[3] A polyepoxy compound represented by the following structural formula.

Butyl acetate 191.4
[3] A polyepoxy compound represented by the following structural formula.

[Structural Formula 4]

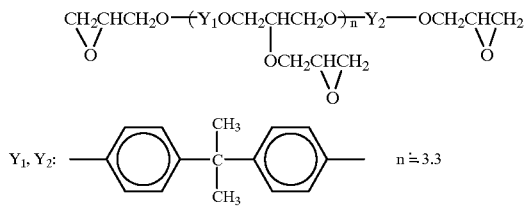

The mixture was heated to 95° C. at which temperature the reaction was continued until an acid value of the reaction mixture reached 1.0 or lower. After cooled to 60° C. 142.7 parts by weight of tetrahydrosuccinic anhydride and 54.5 parts by weight of butyl acetate were added and the reaction was continued for 10 hours. The resulting product was found to have a solids acid value of 103.7 mgKOH/g and a free-radically polymerizable group content of $1.9 \times 10^{-3}$ mole/g.

The reaction mixture was then cooled to 50° C. After addition of 106.5 parts by weight of triethylamine, the reaction mixture was stirred for 20 minutes, followed by addition of 770 parts by weight of deionized water. The resulting mixture was placed under a reduced pressure and heated to remove almost all amount of the organic solvent and a fraction of water to obtain an aqueous solution (A-3) having a solids percentage of 42.4%.

PREPARATION EXAMPLE 4

Preparation of an Aqueous Solution (A-4) via Neutralization of a Compound Having a Free-Radically Polymerized Group and a Carboxyl Group with a Base A 2-liter flask equipped with a reflux tube, thermostat and stirring element was charged with the below-listed ingredients.

| Ingredients | Parts by Weight |
|---|---|
| Polyepoxy compound[4] | 400 |
| Ethylene glycol monomethyl ether acetate | 400 |
| Acrylic acid | 209.7 |
| Methylhydroquinone | 0.15 |
| Tetrabutylammonium bromide | 0.20 |

[4] A polyepoxy compound represented by the following structural formula.

[Structural Formula 5]

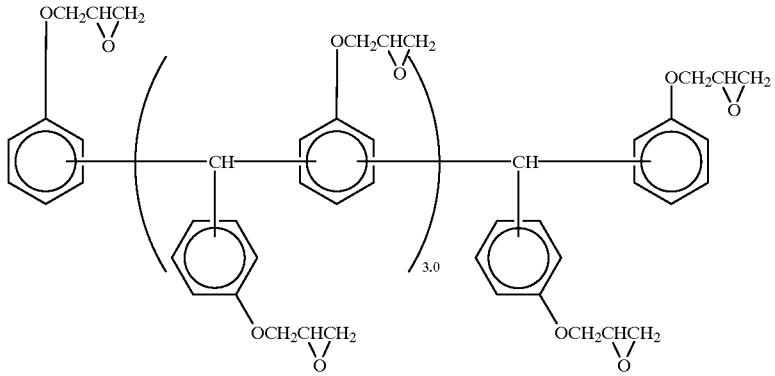

The mixture was heated to 95° C. at which temperature the reaction was continued for 24 hours. The reaction mixture was cooled to 60° C., 230.7 parts by weight of tetrahydrosuccinic anhydride added, and the reaction continued for additional 20 hours. The resulting product was found to have a solids acid value of 99.2 mgKOH/g and a free-radically polymerizable group content of $3.5 \times 10^{-3}$ mole/g.

The reaction mixture was then cooled to 50° C. After addition of 190.0 parts by weight of triethylamine and 1,200 parts by weight of deionized water, the reaction mixture was stirred for 30 minutes. The resulting mixture was placed under a reduced pressure and heated to remove almost all amount of the organic solvent and a fraction of water to obtain an aqueous solution (A-4) having a solids percentage of 44.6%.

Example 1

Preparation of an Aqueous Photosolder Resist Composition

| Ingredients | Parts by Weight |
|---|---|
| B-30[5] | 250 |
| RIONOL GREEN 8200[6] | 5.0 |
| Deionized water | 795 |

The above-specified ingredients were added to 570.5 parts by weight (containing 275 parts by weigh of solids) of the aqueous solution (A-1) obtained in Preparation Example 1. Dispersion of the mixture was achieved in the presence of glass beads by means of a sand grinder.

The below-listed ingredients were added with stirring to 324.1 parts by weight (containing 106 parts by weight of solids) of the above-obtained aqueous dispersion over 20 minutes. After additional 20-minute stirring, the aqueous photosolder resist composition (X-1) was obtained.

Inaredients Parts by Weight

| Ingredients | Parts by Weight |
|---|---|
| EPOLEED GT-400[2] | 25 |
| IRGACURE 907[7] | 8.0 |
| Diethylthioxanthone[8] | 0.5 |
| Trimethylolpropane trimethacrylate | 11.5 |
| Propylene glycol monomethyl ether acetate | 10.0 |

[7] Photoinitiator manufactured by Ciba Geigy Co., Ltd.
[8] Photoinitiator manufactured by Nippon Kayaku Co., Ltd.

Example 2

Preparation of an Aqueous Photosolder Resist Composition

| Ingredients | Parts by Weight |
|---|---|
| B-30[5] | 250 |
| BLUE ES[9] | 5.0 |
| Deionized water | 795 |

The above-listed ingredients were added to 537.1 parts by weight (containing 275 parts by weigh of solids) of the aqueous solution (A-2) obtained in Preparation Example 2. Dispersion of the mixture was accomplished in the presence of glass beads by means of a sand grinder.

The below-listed ingredients were added with stirring to 318.4 parts by weight (containing 106 parts by weight of solids) of the above-obtained aqueous dispersion over 20 minutes. After additional 20-minute stirring, the aqueous photosolder resist composition (X-2) was obtained.

| Ingredients | Parts by Weight |
|---|---|
| EPOLEED GT-400[2] | 25 |
| IRGACURE 907[7] | 8.0 |
| Diethylthioxanthone[8] | 0.5 |
| Trimethylolpropane trimethacrylate | 11.5 |
| Dipropylene glycol monomethyl ether | 10.0 |

Example 3

Preparation of an Aqueous Photosolder Resist Composition

| Ingredients | Parts by Weight |
|---|---|
| B-30[5] | 250 |
| BLUE 4938[10] | 5.0 |
| Deionized water | 421.4 |

[10] Blue pigment manufactured by Dainichi Seika Co., Ltd.

The above-listed ingredients were added to 648.6 parts by weight (containing 275 parts by weigh of solids) of the aqueous solution (A-3) obtained in Preparation Example 3. Dispersion of the mixture was accomplished in the presence of glass beads by means of a sand grinder.

The below-listed ingredients were added with stirring to 265 parts by weight (containing 106 parts by weight of solids) of the above-obtained aqueous dispersion over 20 minutes. After additional 20-minute stirring, the aqueous photosolder resist composition (X-3) was obtained.

| Ingredients | Parts by Weight |
|---|---|
| EPOLEED GT-400[2] | 25 |
| IRGACURE 907[7] | 4.0 |
| Diethylthioxanthone[8] | 1.0 |
| Trimethylolpropane trimethacrylate | 15.0 |
| Propylene glycol monomethyl ether acetate | 10.0 |

Example 4

Preparation of an Aqueous Photosolder Resist Composition

| Ingredients | Parts by Weight |
|---|---|
| B-30[5] | 250 |
| BLUE 4938[10] | 5.0 |
| Deionized water | 453.4 |

The above-listed ingredients were added to 616.6 parts by weight (containing 275 parts by weigh of solids) of the aqueous solution (A-4) obtained in Preparation Example 4. Dispersion of the mixture was accomplished in the presence of glass beads by means of a sand grinder.

The below-listed ingredients were added with stirring to 265 parts by weight (containing 106 parts by weight of solids) of the above-obtained aqueous dispersion over 20 minutes. After additional 20-minute stirring, the aqueous photosolder resist composition (X-4) was obtained.

| Ingredients | Parts by Weight |
| --- | --- |
| ALON-OXETHANE OXT-221[11] | 25 |
| IRGACURE 907[7] | 4.0 |
| Diethylthioxanthone[8] | 1.0 |
| Trimethylolpropane trimethacrylate | 15.0 |
| Propylene glycol monomethyl ether acetate | 10.0 |

[11] Di[1-ethyl(3-oxethanyl)]methyl ether manufactured by Toa Gosei Co., Ltd.

Example 5

Preparation of an Aqueous Photosolder Resist Composition

| Ingredients | Parts by Weight |
| --- | --- |
| B-30[5] | 250 |
| BLUE 4938[10] | 5.0 |
| Deionized water | 421.4 |

The above-listed ingredients were added to an aqueous mixture of 589.6 parts by weight (containing 250 parts by weigh of solids) of the aqueous solution (A-3) obtained in Preparation Example 3 and 83.3 parts by weight (containing 25 parts by weight of solids) of an aqueous solution (D), JOHNCRYL 62 (name used in trade and manufactured by Johnson Polymer Co., Ltd., a neutral aqueous solution of a styrene-acrylic acid copolymer resin, acid value of 200 mgKOH/g). Dispersion of the mixture was accomplished in the presence of glass beads by means of a sand grinder.

The below-listed ingredients were added with stirring to 265 parts by weight (containing 106 parts by weight of solids) of the above-obtained aqueous dispersion over 20 minutes. After additional 20-minute stirring, the aqueous photosolder resist composition (X-5) was obtained.

| Ingredients | Parts by Weight |
| --- | --- |
| EHPE 3150[12] | 25 |
| IRGACURE 907[7] | 4.0 |
| Diethylthioxanthone[8] | 1.0 |
| Trimethylolpropane trimethacrylate | 15.0 |
| Propylene glycol monomethyl ether acetate | 10.0 |

[12] Alicyclic epoxy resin manufactured by Daicel Chem. Co., Ltd.

Example 6

Preparation of an Aqueous Photosolder Resist Composition

| Ingredients | Parts by Weight |
| --- | --- |
| B-30[5] | 250 |
| BLUE 4938[10] | 5.0 |
| Deionized water | 453.4 |

The above-listed ingredients were added to an aqueous mixture of 560.5 parts by weight (containing 250 parts by weigh of solids) of the aqueous solution (A-4) obtained in Preparation Example 4 and 75.0 parts by weight (containing 25 parts by weight of solids) of an aqueous solution (D), SMA1440H (name used in trade and manufactured by Elphatochem Co., Ltd., a neutral aqueous solution of a styrene-maleic acid copolymer resin, acid value of 185 mgKOH/g). The resulting mixture was dispersed in the presence of glass beads by means of a sand grinder.

The below-listed ingredients were added with stirring to 265 parts by weight (containing 106 parts by weight of solids) of the above-obtained aqueous dispersion over 20 minutes. After additional 20-minute stirring, the aqueous photosolder resist composition (X-6) was obtained.

| Ingredients | Parts by Weight |
| --- | --- |
| EHPE 3150[12] | 25 |
| IRGACURE 907[7] | 4.0 |
| Diethylthidxanthone[8] | 1.0 |
| Trimethylolpropane trimethacrylate | 15.0 |
| Propylene glycol monomethyl ether acetate | 10.0 |

Comparative Example 1

Preparation of an Aqueous Photosolder Resist Composition Containina a Glycidyl Group

| Ingredients | Parts by Weight |
| --- | --- |
| B-30[5] | 250 |
| RIONOL GREEN 8200[6] | 5.0 |
| Deionized water | 795 |

The above-specified ingredients were added to 570.5 parts by weight (containing 275 parts by weigh of solids) of the aqueous solution (A-1) obtained in Preparation Example 1. Dispersion of the mixture was achieved in the presence of glass beads by means of a sand grinder.

The below-listed ingredients were added with stirring to 324.1 parts by weight (containing 106 parts by weight of solids) of the above-obtained aqueous dispersion over 20 minutes. After additional 20-minute stirring, the aqueous photosolder resist composition (Y-1) was obtained.

| Ingredients | Parts by Weight |
| --- | --- |
| EOCN-104S[1] | 25.0 |
| IRGACURE 907[7] | 8.0 |
| Diethylthioxanthone[8] | 0.5 |
| Trimethylolpropane trimethacrylate | 11.5 |
| Dipropylene glycol monomethyl ether | 10.0 |

Comparative Example 2

Preparation of an Aqueous Photosolder Resist Composition Containing an Emulsion Stabilizer

| Ingredients | Parts by Weight |
| --- | --- |
| IRGACURE 907[7] | 8.0 |
| Diethylthioxanthone[8] | 0.5 |
| Trimethylolpropane trimethacrylate | 50.0 |
| B-30[5] | 250 |
| RIONOL GREEN 8200[6] | 1.0 |
| Propylene glycol monomethyl ether acetate | 6.7 |

The above-specified ingredients were added to 75 parts by weight (containing 55.0 parts by weigh of solids) of the resin of Preparation Example 1 prior to being neutralized by triethylamine, and subsequently intimately mixed by means of a roll mill.

An emulsion was obtained by adding the resulting mixture to a 4.0 wt.% aqueous solution of PVA 217EE (polyvinyl alcohol manufactured by Kuraray Co., Ltd.) to a solids percentage of 50 weight %.

Another emulsion was prepared by adding 8.3 parts by weight of a mixture containing GT-401 (alicyclic epoxy resin manufactured by Daicel Chem. Co., Ltd., which a terminal alicyclic epoxy-containing product of ring-opening addition of ε-caprolactone to butanetetracarboxylic acid) and propylene glycol monomethyl ether acetate to a 4.0 wt.% aqueous solution of PVA 217EE to a solids percentage of 50 weight %. The former photocurable emulsion and the latter alicyclic epoxy-containing emulsion were blended in proportions by weight of 75:25 to obtain an aqueous photosolder resist composition (Y-2) incorporating an emulsion stabilizer.

Comparative Example 3

Preparation of an Aqueous Photosolder Resist Composition Containing a Large Amount of Solvent The procedure of Example 1 was followed, except that the amount of propylene glycol monomethyl ether acetate was changed from 10 to 70 parts by weight, to obtain a photosolder resist composition (Y-3).

Evaluation Tests

Each of the aqueous photosolder resist compositions obtained in Examples 1–6 and Comparative Examples 1–3 was applied by a doctor blade, in the form of a film, to a pattern copper foil substrate for evaluating developability and soldering temperature resistance of the film and also to an IPC B-25 comb electrode coupon for evaluating eleactrical insulation property, respectively to a thickness of 25–30 $\mu$m. After dried at 80° C. for 20 minutes, each film was exposed to a light at 200 mj/cm$^2$ through a negative, developed with an aqueous solution of sodium carbonate at a spray pressure of 1 kg/cm$^2$, and heat treated at 15° C. for 45 minutes. Evaluation was made on the basis of the following evaluation standards. Developability was evaluated for each sample both immediately after preparation and after 15-day storage at 40° C.

(1) Developability

The developability of the film on each copper foil substrate was evaluated by visually observing the sharpness of 50/50 ($\mu$m) lines.

(2) Soldering Temperature Resistance

Each copper foil substrate obtained was coated with a resin flux and then immersed in a solder bath maintained at 260° C. After the flux was cleaned by a modified alcohol, the occurrences of blistering and peeling of the resist layer were visually observed. Evaluation results are reported according to the following ratings:

The rating "⊚" indicates no occurrence of peeling after six or more cycles of 10- or 15-second immersion;

The rating "○" indicates no occurrence of peeling after three to five cycles of 10- or 15-second immersion;

The rating "Δ" indicates the occurrence of slight peeling after three or more cycles of 10- or 15-second immersion; and The rating "x" indicates the occurrences of appreciable blistering and peeling after a first cycle of 10- or 15-second immersion.

(3) Electrical Insulation

A bias voltage of DC 500 V was applied across the comb electrode of each IPC B-25 coupon obtained to measure a value for insulation resistance.

(4) Solvent Odor

The production of perceptible solvent odor was checked during the manufacture of resists from aqueous photosolder resist compositions.

TABLE 1

| Evaluation Item | | Examples | | | | | | Comparative Examples | | |
| --- | --- | --- | --- | --- | --- | --- | --- | --- | --- | --- |
| | | 1 | 2 | 3 | 4 | 5 | 6 | 1 | 2 | 3 |
| Developability | Immediately After Preparation | Good | Good | Good | Good | Good | Good | Good | Good | Good |
| | After 15-Day Storage at 40° C. | Good | Good | Good | Good | Good | Good | Failed *1 | Failed *1 | Good |
| Soldering Temperature Resistance (260° C./10 sec.) | | ○ | ○ | ⊚ | ⊚ | ⊚ | ⊚ | ○ | x | ⊚ |
| Soldering Temperature Resistance (260° C./15 sec.) | | ○ | ○ | ○ | ○ | ⊚ | ⊚ | Δ | x | ○ |

TABLE 1-continued

| | Examples | | | | | | Comparative Examples | | |
|---|---|---|---|---|---|---|---|---|---|
| Evaluation Item | 1 | 2 | 3 | 4 | 5 | 6 | 1 | 2 | 3 |
| Electrical Insulation (Ω) | $10^{13}$ | $10^{13}$ | $10^{13}$ | $10^{13}$ | $10^{13}$ | $10^{13}$ | $10^{13}$ | $10^{11}$ | $10^{13}$ |
| Solvent Odor | Absent | Absent | Absent | Absent | Absent | Absent | Absent | Absent | Present |

*1 Due to Gelation of the Composition

As can be appreciate from the above results, the aqueous photosolder resist compositions of the present invention exhibit the improved storage stability and result in solder resist films with improved properties, compared to those containing glycidyl groups or emulsion stabilizers. Also, they are free from unpleasant solvent odor.

As can be seen from Table 1, the aqueous compositions of Examples 5 and 6 both containing the aqueous solution (D), when formed into solder resist films, exhibit the further improved solder temperature resistance compared to those of Example 1–4.

The improved storage stability of aqueous photosolder resist compositions of the present invention is attributed not only to their emulsion form whereby reactive groups are separated, but also to their incorporation of cyclic ether groups which show little or no tendency to deactivate in aqueous media. In addition, the aqueous photosolder resist compositions of the present invention, exclusive of emulsion stabilizers, are self-emulsifiable. This assures formation of solder resist films with improved properties.

The aqueous photosolder resist compositions of the present invention contain the markedly reduced amount of organic solvent relative to conventional solvent-borne compositions. This releases people from work at unpleasant atmosphere and makes the resist components environment-friendly. The aqueous form of the photosolder resist compositions of the present invention is effective in dispersing therein inorganic fillers used to assure the improved heat resistance.

What is claimed is:

1. An aqueous photosolder resist composition containing:
   (A) an aqueous solution prepared by neutralizing a resin containing a free-radically polymerizable group and a carboxyl group with a base;
   (B) an inorganic filler;
   (C) a photocurable mixture comprising,
      (c-1) a multifunctional acrylic monomer,
      (c-2) a compound having a cyclic ether group other than a glycidyl group, and
      (c-3) a photoinitiator; and optionally
   (D) an aqueous solution prepared by neutralizing a free-radically polymerized substance having an acid value of 130–230 mgKOH/mg.

2. The aqueous photosolder resist composition of claim 1 wherein said cyclic ether group other than a glycidyl group is an alicyclic epoxy or oxetane group.

3. The aqueous photosolder resist composition of claim 1 wherein said resin has a free-radically polymerizable group content of $5 \times 10^{-4}$–$1 \times 10^{-2}$ mole/g and a carboxyl group content of 30–200 mgKOH/g.

4. The aqueous photosolder resist composition of claim 1 wherein a ratio by weight of the carboxyl groups present in the aqueous solutions (A) and (D) to the cyclic ether groups, other than glycidyl groups, present in the photocurable mixture (C) is 1.3/0.7–0.7/1.3.

5. The aqueous photosolder resist composition of claim 1 further containing coloring pigment.

6. The aqueous photosolder resist composition of claim 1 wherein said inorganic filler is contained in the amount of 5–60 parts by weight, based on 100 parts by weight of solids in the composition.

7. The aqueous photosolder resist composition of claim 1 wherein a solvent content does not exceed 20 parts by weight, based on 100 parts by weight of solids in the composition.

* * * * *